United States Patent [19]
Nakao

[11] Patent Number: 5,813,851
[45] Date of Patent: Sep. 29, 1998

[54] HEAT TREATMENT METHOD

[75] Inventor: Ken Nakao, Sagamihara, Japan

[73] Assignee: Tokyo Electron, Ltd., Tokyo-to, Japan

[21] Appl. No.: 708,710

[22] Filed: Sep. 5, 1996

[30]   Foreign Application Priority Data

Sep. 7, 1995 [JP] Japan .................................. 7-256725

[51] Int. Cl.⁶ .................................................. F27D 5/00
[52] U.S. Cl. .................................. 432/6; 432/5; 432/241; 432/152
[58] Field of Search ................................. 432/241, 5, 6, 432/11, 153, 158

[56]       References Cited

U.S. PATENT DOCUMENTS

| | | | |
|---|---|---|---|
| 5,249,960 | 10/1993 | Monoe | 432/241 |
| 5,273,423 | 12/1993 | Shiraiwa | 432/241 |
| 5,277,579 | 1/1994 | Takanabe | 432/241 |
| 5,328,360 | 7/1994 | Yokokawa | 432/241 |
| 5,360,336 | 11/1994 | Monoe | 432/241 |
| 5,445,521 | 8/1995 | Yamaguchi et al. | 432/241 |
| 5,507,639 | 4/1996 | Monoe | 432/77 |
| 5,525,057 | 6/1996 | Monoe | 432/241 |
| 5,556,275 | 9/1996 | Sakata et al. | 432/241 |
| 5,578,132 | 11/1996 | Yamaga et al. | 432/241 |

*Primary Examiner*—Teresa J. Walberg
*Assistant Examiner*—Jiping Lu
*Attorney, Agent, or Firm*—Beveridge, DeGrandi, Weilacher & Young, LLP

[57]       ABSTRACT

When a wafer boat having wafers, objects to be treated, placed thereon is loaded into a reaction tube, which is then raised in temperature by a heating section at a speed of 50° C./min or more, a pressure reduction degree of the reaction tube is lowered or a hydrogen gas is supplied. A surface roughness of a portion in contact with the wafers on the wafer boat is 50 μm or less. Thereby, a heat transfer coefficient relative to the wafers is improved to suppress an in-plane temperature difference smaller. Accordingly, when the objects to be treated are raised in temperature in the reaction tube for heat treatment, it is possible to suppress the in-plane temperature difference of the substances to be smaller to prevent an occurrence of a slip or warp which leads to the lowering of a yield.

3 Claims, 6 Drawing Sheets

ALLOWABLE RANGE OF IN-PLANE TEMPERATURE DIFFERENCE

| TEMPERATURE INCREASING LEVEL (°C) | 400 → 800 | 400 → 850 | 400 → 900 |
|---|---|---|---|
| PRESSURE 0.5 Torr | 32.2 °C | 33.7 °C | 33.8 °C |
| 2.0 Torr | 28.7 °C | 29.2 °C | 29.9 °C |
| 10 Torr | 19.6 °C | 22 °C | 22.5 °C |
| 760 Torr | 18.5 °C | 21.7 °C | 22.5 °C |

RELATIONSHIP BETWEEN PRESSURE IN A REACTION SPACE AND MAXIMUM IN-PLANE TEMPERATURE DIFFERENCE

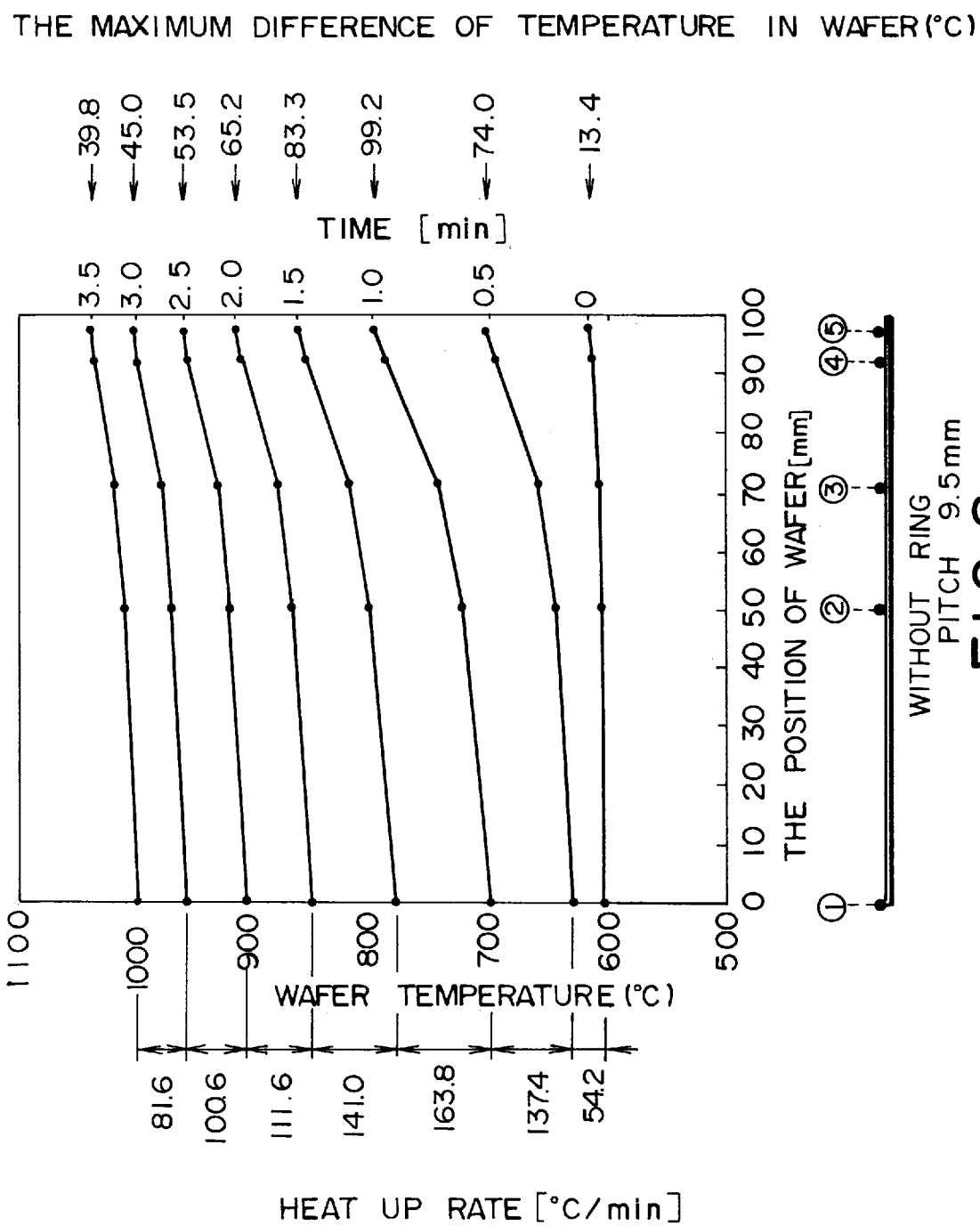

HEAT TREATMENT METHOD

BACKGROUND OF THE INVENTION

The present invention relates to a heat treatment method for an object to be treated such as a semiconductor device.

Here, the production process for a semiconductor wafer (hereinafter merely referred to as "a wafer") in which a semiconductor device, for example, such as LSI, is formed on the surface thereof will be described by way of an example. In the past, a process for applying a heat treatment to a wafer has been carried out in order to form an oxide layer on the surface of a wafer, or in order to diffuse dopant. For such a heat treatment, there has been often used a so-called vertical heat treatment apparatus which less drags open air into the apparatus and which can save a space.

The vertical heat treatment apparatus of this kind is so designed that generally, a reaction tube for forming a reaction space therein is provided in a heating tubular furnace erected vertically, a predetermined number (for example, 100) of wafers, objects to be treated, are placed at vertical intervals in a horizontal state on a placing jig made of quartz called a wafer boat, and the wafers along with the wafer boat are moved up and down by a suitable lift mechanism so as to load them into or unload them from the reaction tube.

The treatment is accomplished by first heating the reaction tube to a temperature lower than a treatment temperature, for example, 400° C., loading the placing jig into the reaction tube, reducing the pressure in the reaction tube to a pressure reduction degree necessary for predetermined treatment, for example, 0.5Torr, and raising the temperature of the reaction space to a predetermined treatment temperature, for example, 800° C., at a predetermined temperature-up speed, for example, at a speed of 50° C./min or more. Then, a silicon oxide layer is formed on the surface of a wafer, for example, while maintaining the aforesaid temperature, and after formation of the layer, the temperature is again lowered down to 400° C. at a predetermined speed, and the wafer boat is unloaded from the reaction tube.

However, when after the wafers have been loaded into the reaction tube, the reaction tube is raised in temperature at a high speed, for example, at a speed of 50° C./min under the atmosphere of the treatment pressure reduction degree, there occurs a temperature difference between the peripheral edge portion and the central portion of the wafer. Because of this, a sort of crystal fault called a slip occurs on the surface of the wafer, or a warp occurs on the wafer itself due to an in-plane temperature difference. Such a defect on the wafer leads to the lowering of the yield of the product.

SUMMARY OF THE INVENTION

The present invention has been accomplished in view of the foregoing. It is an object of the present invention to provide a heat treatment method comprising: charging, while substances to be treated such as wafers being placed on a placing jig such as a wafer boat, the same into a heat treatment space in a reaction tube; and when the wafers are raised in temperature at a high speed to a predetermined treatment temperature, suppressing an in-plane temperature difference of the substances to be treated, whereby preventing the aforementioned slip or the warp of the object to be treated from occurring to improve the yield of the product throughput.

In the light of the foregoing, the present invention is intended to suppress the in-plane temperature difference by improving the heat transfer coefficient of the reaction space. More concretely, the present invention provides a heat treatment method having the following construction.

The present invention provides a heat treatment method comprising: inserting object to be treated into a reaction space constructed for applying a heat treatment thereto, heating the reaction space to a predetermined heat treatment temperature via the process for raising a temperature of the reaction tube at a speed of 50° C. or more, and applying a heat treatment to the object to be treated at a predetermined pressure reduction degree, characterized in that the reaction space is raised in temperature under the pressure higher than the pressure reduction degree when the object to be treated are treated.

Incidentally, the heat movement between a heating source such as a heater and object to be treated in a reaction tube is done by radiation, convection and transfer through the reaction space atmosphere. The higher the pressure reduction degree (vacuum degree), the smaller the heat movement due to the convection and transfer.

According to the heat treatment method of the present invention, the pressure is adjusted at the time of temperature up, and the temperature is raised at a speed of 50° C. or more to a predetermined treatment temperature, during which the pressure reduction degree is suppressed as compared with that at the time of treatment (that is, approximating the ordinary pressure), and after reaching a predetermined treatment temperature, the pressure is reduced. Thus, it is possible to suppress the reduction in the heat movement due to the convection and transfer in the reaction space to improve a heat transfer coefficient and to suppress an in-plane temperature difference of object to be treated.

BRIEF DESCRIPTION OF THE DRAWINGS

FIG. 8 is a graph showing the relationship between the distance from the center of a wafer and an in-plane temperature difference of a wafer every temperature up speed in the case where a wafer susceptor is not used.

DETAILED DESCRIPTION OF THE PREFERRED EMBODIMENTS

The heat treatment method according to the present invention will be described hereinafter with reference to the accompanying drawings.

Figure 1:
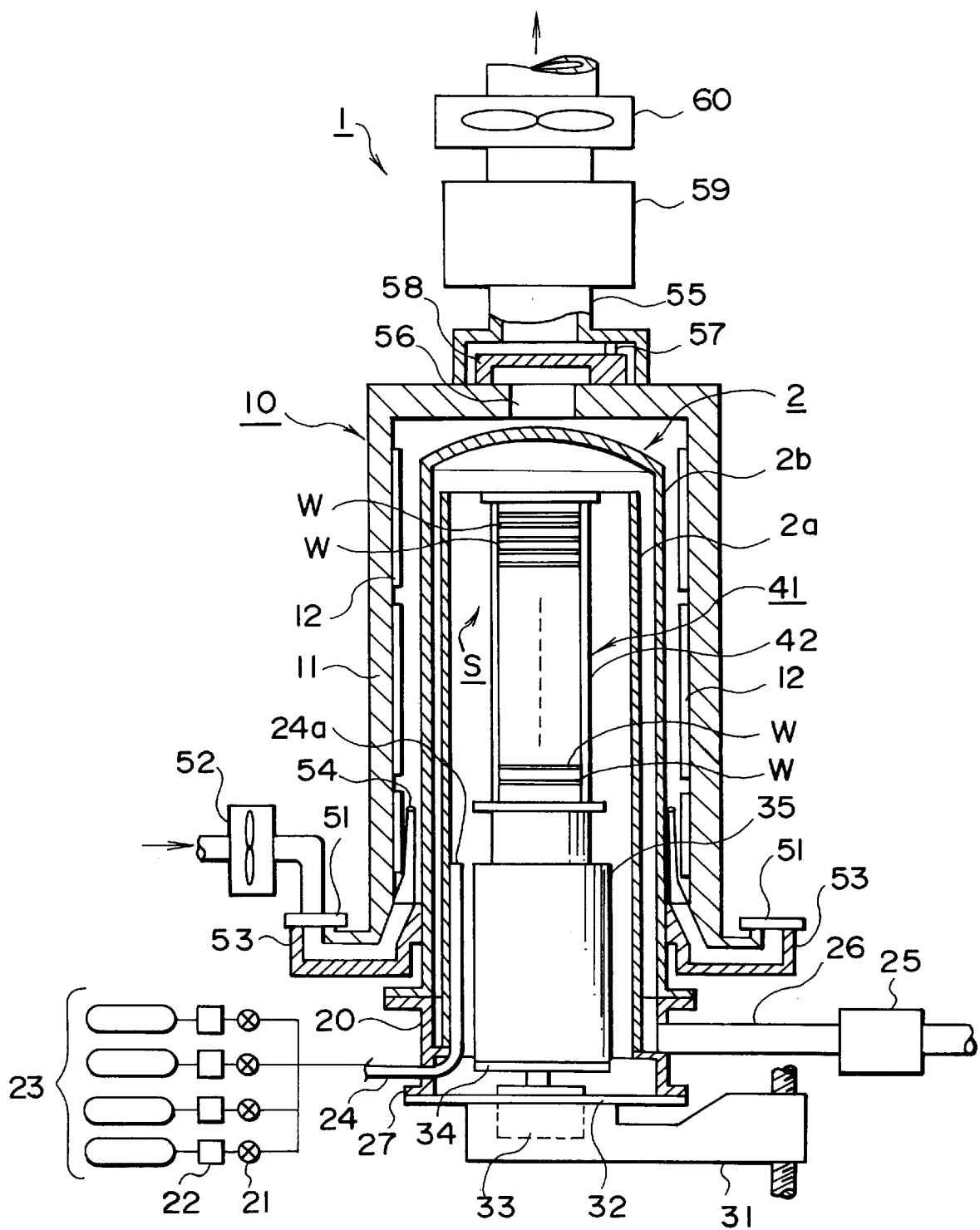
FIG. 1 is a schematic longitudinal sectional view of a vertical heat treatment apparatus used for carrying out a heat treatment method according to the present invention.

FIG. 1 is a schematic longitudinal sectional view of the entire vertical heat treatment apparatus for carrying out the heat treatment method according to the present embodiment. In the present embodiment, a reaction space S so constituted as to apply a heat treatment to an object to be treated is formed interiorly of a reaction tube 2. The reaction tube 2 itself comprises a double tube consisting of a substantially tubular inner tube 2a formed of, for example, quartz, and an outer tube 2b whose upper end is closed in the form of substantially a dome.

Figure 2:
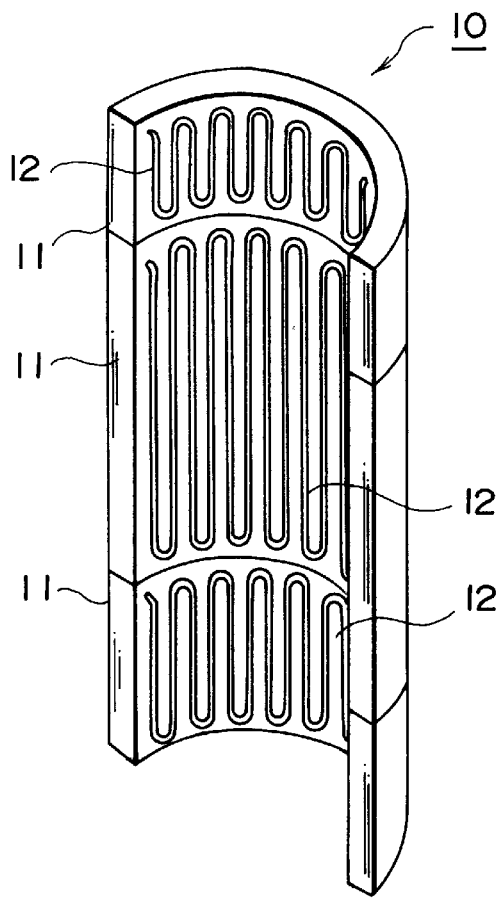
FIG. 2 is a perspective view of a heating section of the vertical heat treatment apparatus shown in FIG. 1.

A heating section 10 is arranged in the circumference of the reaction tube 2 to raise the temperature in the reaction space S to a predetermined level. The heating section 10 has a plurality of rows of heating blocks, provided with a resistance heat generating wire 12 in the peripheral direction while being suitably bent, in the inner peripheral surface of a heat insulator 11, as shown in FIG. 2. As the resistance heat generating wire 12, for example, $MoSi_2$ (disilicate molybdenum) can be used. In this case, the reaction space S in the reaction tube 2 can be raised in temperature at a high speed of 50° to 100° C./min.

As shown in FIG. 1, the reaction tube 2 is airtightly joined to and supported on, through, for example, an O-ring (not shown), a metallic manifold 20 formed, for example, of stainless steel secured to a base plate (not shown). The manifold 20 has a side wall through which extends a gas supply pipe 24 connected to a gas supply source 23 for supplying a predetermined gas through a valve 21 and a mass flow controller 22. Further, the gas supply pipe 24 extends into the inner tube 2a of the reaction tube 2 and bends upward, and a supply port 24a formed at an extreme end thereof is positioned in the vicinity of the lower end of a wafer boat 41.

An exhaust pipe 26 provided with an exhaust means 25 such as a turbo molecular pump is connected to the manifold 20 so that the reaction space S in the reaction tube 2 can be vacuumed to set and maintain a predetermined reduced pressure.

Further, the manifold 20 is formed at a peripheral edge of an opening at the lower end thereof with a flange portion 27. The flange portion 27 comes in close contact with a lid 32 provided on a lift 31 by upward movement of the lid 32 so as to close the reaction tube 2.

A wafer W, an object to be treated, is placed on a wafer boat 41 to be moved up and down by the lift 31, and the wafer W is loaded on and unloaded from the reaction space S in the reaction tube 2.

The lift 31 is provided with a rotation drive mechanism 33, a heat insulating tube 35 is provided on the upper surface of a turn table 34 that can be rotated by the rotation drive mechanism 32, and the wafer boat 41 for placing a wafer W thereon is arranged on the heat insulating tube 35.

Figure 3:
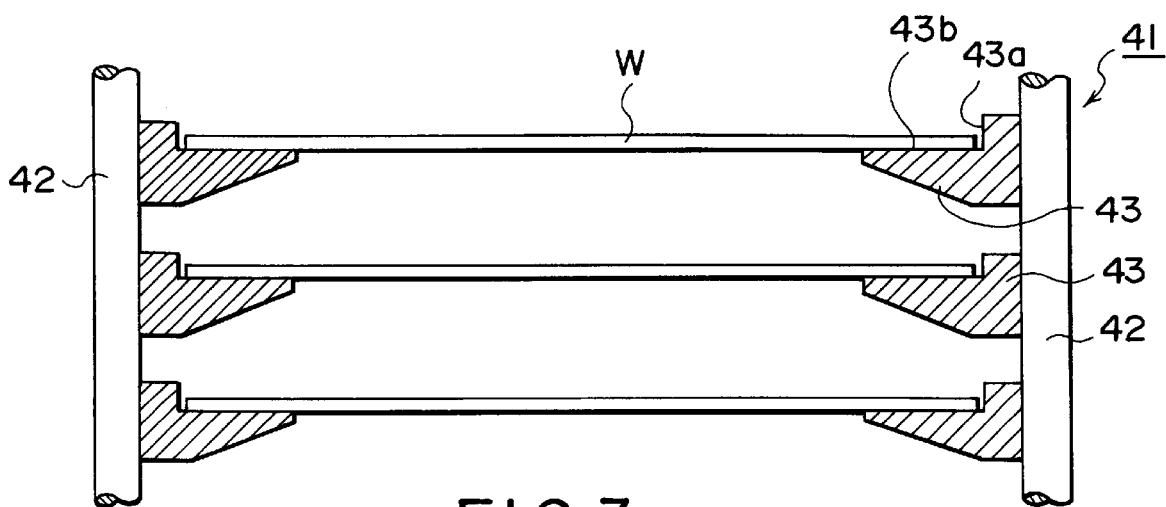
FIG. 3 is a longitudinal sectional view of a main part of a wafer boat used in the vertical heat treatment apparatus shown in FIG. 1.

As shown in FIG. 3, the wafer boat 41 is constructed such that ring-like susceptors 43 made of a material having a large heat capacity, for example, such as quartz or SiC, are disposed vertically evenly at predetermined intervals on, for example, four columns made of quartz or SiC arranged in the peripheral direction. The wafer W, an object to be treated, is placed on each susceptor 43 with the peripheral edge thereof placed in contact with and held on each susceptor 43. As shown in FIG. 3, preferably, the susceptor 43 has its peripheral edge 43a formed to be slightly higher than the surface of the wafer W so that the suscepter 43 itself has a thickness such that the inner periphery thereof is thicker than the outer periphery thereof, which however may be of the same thickness.

Figure 4:
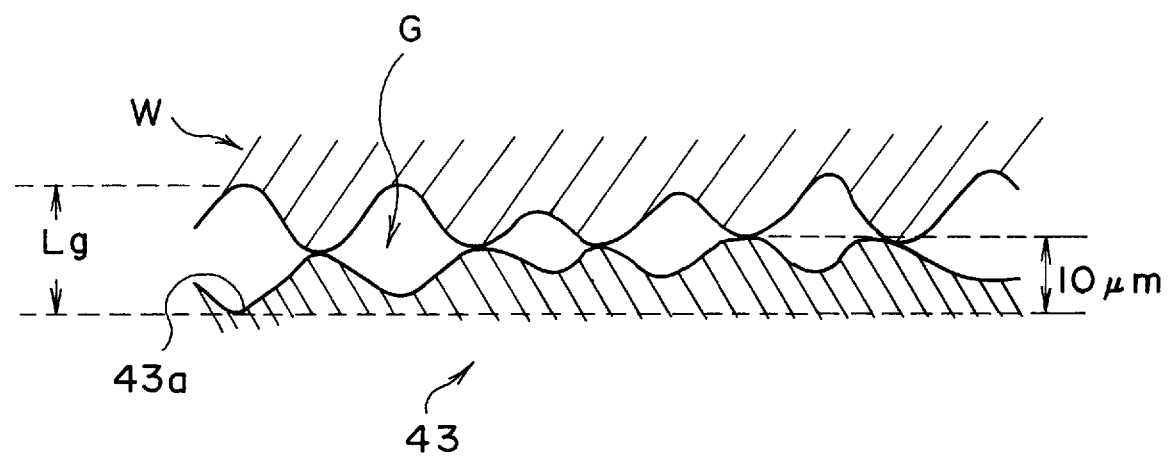
FIG. 4 is an enlarged longitudinal sectional view of a contact portion between a wafer susceptor and a wafer in the heat treatment method according to the present invention.

The surface of a suscepter surface 43b in contact with the upper surface of the wafer W, i.e., the lower surface of the wafer is finished to roughness of 10 μm (10 Ra). That is, as shown in FIG. 4, the surface of the suscepter 43b is processed to have a very fine surface so that the distance from the top to the bottom of the surface of the susceptor surface 43b is 10 μmm.

Between the lower end of the heating section 10 and the reaction tube 2 are formed, in the peripheral direction of the reaction tube 2, for example, four suction pipes which are opened to the outside of the apparatus through a shutter 51 or in communication with an air fan 52, as shown in FIG. 1. A nozzle 54 is provided at the extreme end of the suction pipe 53.

On the other hand, the upper surface of the heating section 10 is formed with an exhaust port 56 in communication with an exhaust duct 55, and the exhaust duct 55 is provided with a shutter 58 which turns about a support shaft 57 in order for opening and closing the exhaust port 56. At the downstream of the shutter 58, a heat exchanger 59 and an air fan 60 are provided so as to exhaust air to the central exhaust passage of the factory or the like (factory exhaust). These apparatuses serve as forced cooling means for forcibly cooling the interior of the reaction tube 2 after the wafer W has been heat treated as desired.

A description will be made hereinafter of the case where the wafer W is heat treated, for example, to form an oxide layer thereon using the vertical heat treatment apparatus 1. First, the reaction space S in the reaction tube 2 is set to a temperature of 400° C. by the heating section 10 shown in FIG. 1. The wafer boat 41 on which a predetermined number, for example, 100 wafers W, objects to be treated, are placed is moved upward by the lift 31 to load the wafers W in the reaction space S, and the flange portion 27 is placed in close contact with the lid 32 to cut off the interior of the reaction tube 2 from the outside.

Then, the interior of the reaction tube 2 is raised in temperature by the heat generated from the resistance heat generating wire 12 of the heating portion section 10, and the temperature of the reaction space S is raised to, for example, 850° C. to 900° C., a treatment temperature, after which the predetermined heat treatment, for example, the oxide layer forming treatment, is carried out. In this case, if the pressure reduction degree in the reaction space S is relieved more than that at the time of the treatment (approximating the ordinary temperature) to raise the temperature, it is possible to suppress the in-plane temperature difference of the wafer W to be smaller and suppress an occurrence of a slip and a warp of a wafer W, which are crystal defects.

That is, in the conventional method, the pressure is preset to and maintained at a predetermined pressure reduction degree, for example, 0.5 Torr, and after this, the reaction space S is reduced in pressure. However, the vacuum degree in the reaction tube 2 is once reduced to, for example, 10 Torr, during temperature up to adjust pressure and after the temperature is raised, whereby the heat transfer coefficient in the reaction space S of the reaction tube 2 can be improved more than conventional art. As a result, it is possible to suppress the in-plane temperature difference of the wafer W, an object to be treated, which is present in the reaction space S.

Alternatively, it is also possible to suppress the in-plane temperature difference of the wafer W to be smaller by supplying a hydrogen gas into the reaction tube 2, when a temperature is raised, to make the interior of the reaction space S a hydrogen gas atmosphere to raise the temperature.

According to the insight of the inventor, the value of the in-plane temperature difference at which defects such as a slip occur in the wafer W as the treatment temperature rises becomes small. That is, a level of an allowable in-plane temperature difference becomes small. This situation will be explained with reference to the graph shown in FIG. 5. There is the possibility that when an in-plane temperature difference becomes larger than the value indicated by the broken line X in the graph, some kind of adverse influence such as a heat distortion occurs. Accordingly, it is necessary to suppress the in-plane temperature difference to the range not beyond the solid line Y, preferably, the range not beyond the broken line X.

The reaction space S in the reaction tube 2 is made a mere inactive atmosphere by, for example, an $N_2$ gas, without using the hydrogen gas atmosphere as in the above-described process. The surface roughness of the contact portion 43b with the wafer W on the wafer boat 41 is set to 6.3 Ra. Then, the temperature is raised at a high speed merely by the pressure control. As a result, the result is as shown in FIG. 6.

Figures 5, 6:
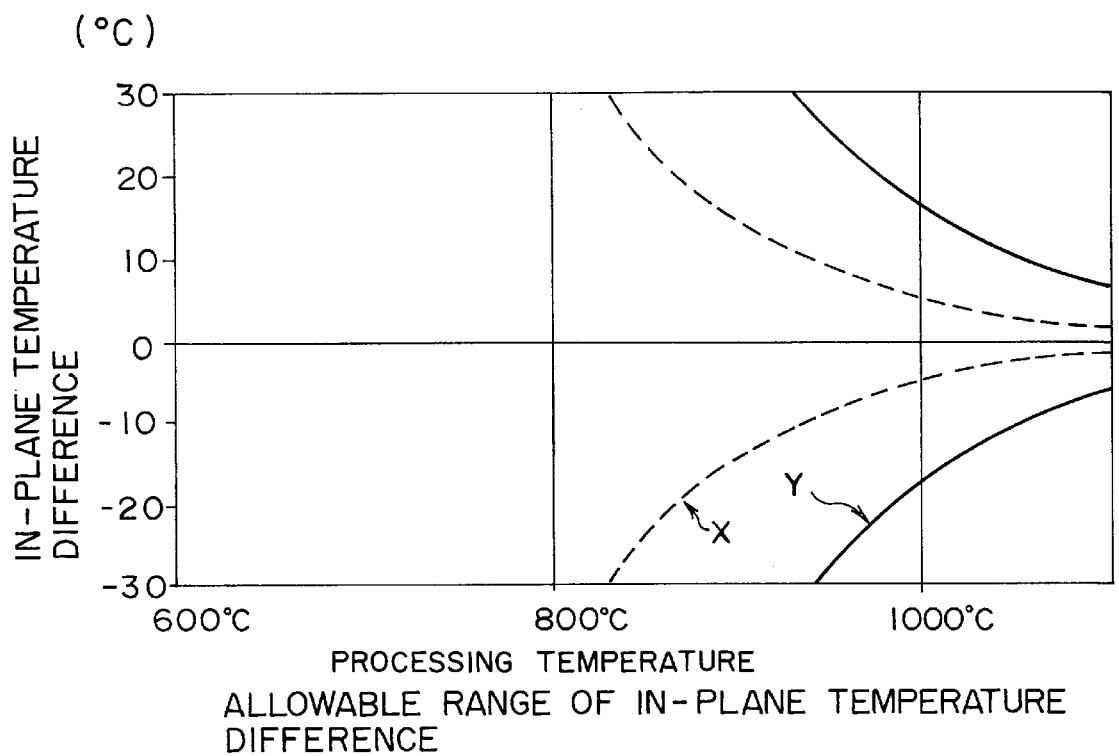
FIG. 5 is a graph showing an allowable range of an in-plane temperature difference of the wafer.
FIG. 6 is a table showing a maximum in-plane temperature difference every temperature up level according to the heat treatment apparatus of the present invention when a pressure in a reaction space is changed in the case where the interior of the reaction space in a reaction tube is increased in temperature.

According to the above, when the temperature is raised from 400° C. to 850° C., a treatment temperature, while maintaining the pressure reduction degree of 0.5 Torr in the vicinity of the treatment pressure reduction degree as in conventional art, the in-plane temperature difference is 33.7° C. at the maximum as shown in the uppermost column in FIG. 6, which greatly exceeds the range indicated by the broken line X in the graph in FIG. 5.

However, in the case where the temperature is raised under the same conditions as that mentioned above while the reaction space S being reduced in pressure to 10 Torr, as in the heat treatment process in the embodiment of the present invention, the maximum in-plane temperature difference is suppressed to 22° C. as shown in the third column of FIG. 6, which does not exceed the range indicated by the broken line X. Neither slip nor heat distortion and warp of a wafer occurs. Accordingly, the in-plane temperature difference is suppressed as compared with conventional art, and the occurrence of slip and warp of a wafer can be suppressed by that portion. Of course, also, in the case where the temperature is raised at a high speed merely by the pressure regulation while maintaining the surface roughness of the contact portion 43b with the wafer W on the wafer boat 41 at a conventional degree (100 μm), it is possible to suppress the in-plane temperature difference.

In this case, the hydrogen gas is supplied into the reaction space S to make it a hydrogen gas atmosphere, and the surface roughness of the contact surface 43b of the susceptor 43 in contact with the wafer W is made fine. Then, the heat transfer coefficient to the wafer W in the reaction space S is further improved. This can suppress the in-plane temperature difference produced in the wafer W to be smaller.

The above fact will be described in more detail. Let A be the contact area between the wafer W and the susceptor 43, and since the actual contact state is as shown in FIG. 4, let Ac be the true contact area, Av the area of a gap, Lg the thickness of the gap, Ka the heat transfer coefficient of the wafer W, Kb the heat transfer coefficient of the susceptor 43, and Kf be the heat transfer coefficient of a gap G, then the contact heat transfer coefficient Hc between the wafer W and the susceptor 43 is given by the following equation:

$$Hc=(1/Lg)[\{(Ac/A)(2KaKb)/(Ka+Kb)\}+(Av/A)Kf]$$

(See the formula 2-40, p. 44, [HEAT TRANSFER ENGINEERING(I)], Maruzen K.K. (1982) by J. P. Hallman)

Accordingly, if the roughness of the surface of the susceptor surface 43b of the susceptor 43 shown in FIG. 3 and FIG. 4 is made fine, the true contact area Ac between the wafer W and the susceptor 43 increases according to the above-described equation. On the other hand, when as the gas of the gap G, i.e., the gas in the reaction space S of the reaction tube 2, a hydrogen gas having a high heat transfer coefficient is used, the heat transfer coefficient Kf of the gap increases.

Figure 7:
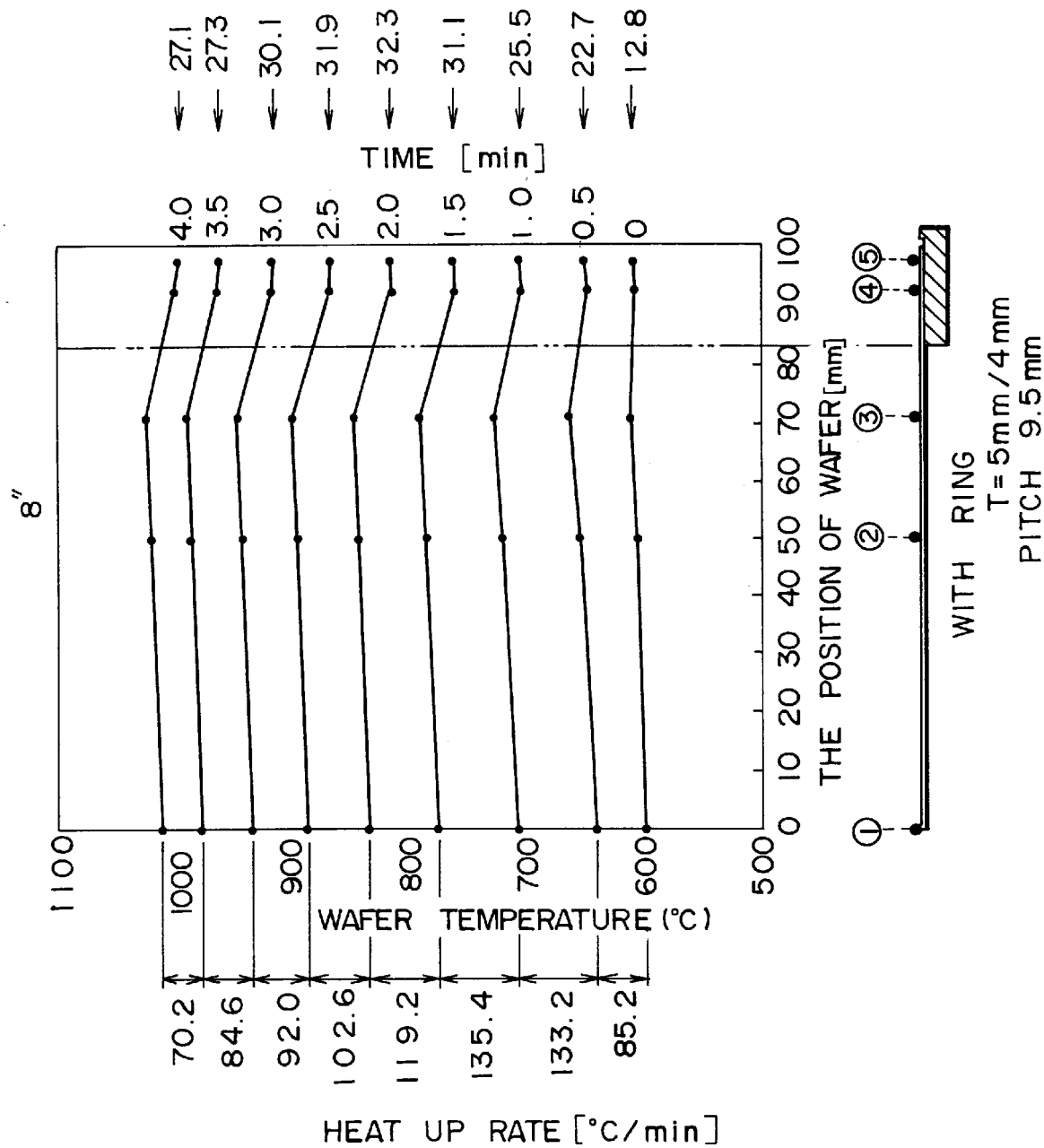
FIG. 7 is a graph showing the relationship between the distance from the center of a wafer and an in-plane temperature difference of a wafer every temperature up speed in the case where a wafer susceptor is used.

As a result, the contact heat transfer coefficient Hc between the wafer W and the susceptor 43 is improved, and therefore, the very high heat transfer coefficient as a whole can be obtained together with the improvement of the heat transfer coefficient resulting from the pressure regulation described above. Accordingly, the in-plane temperature difference in the wafer W can be considerably suppressed as compared with conventional art to prevent not only the slip but also the warp of the wafer itself, as a consequence of which the yield can be improved (see FIGS. 7 and 8).

In the above-described embodiment according to the present invention, there has employed the process which employs all the three points, the relief of the pressure reduction degree at the time of temperature up in the reaction tube, the temperature-up at a hydrogen gas atmosphere caused by a supply of hydrogen gas, and the increase in the true contact area between the susceptor surface 43b of the susceptor 43 and the wafer W as the result of making the roughness thereof fine thereby to raise the temperature. Alternatively, even if, out of these three features, only one is employed, or a combination of suitable two features is employed, the occurrence of the slip and the warp of the wafer can be suppressed as compared with conventional art.

Since the high speed temperature up in excess of 50° C./min is possible as mentioned above, the present invention is particularly useful for the heat treatment method and apparatus which are intended for a high throughput. The yield under the high through-put as a whole can be improved.

While in the aforementioned embodiment, a description has been made of the case where the wafer W is subjected to the oxide treatment, it is to be noted that the present invention is not limited thereto but the present invention can be applied to the case where various substances to be treated including a wafer and an LCD substrate are subjected to the heat treatment under the predetermined pressure reduction.

What is claimed is:

1. A method for applying a heat treatment to objects to be treated at a pressure, the method comprising the steps of:
   (i) inserting objects to be treated placed on a susceptor into a reaction space constructed for applying a heat treatment thereto,
   (ii) raising a temperature of said reaction space at a speed of 50° C./minute or more to heat said reaction space to a predetermined heat treatment temperature and heat treating the objects to be treated at a pressure of 10 Torr or more, and
   (iii) heating the objects inserted into said reaction space at a predetermined heat treatment temperature for treatment by a processing gas under a pressure less than the pressure of step (ii).

2. The heat treatment method according to claim 1, wherein said reaction space is made under a $H_2$ (hydrogen gas) or He (helium) gas atmosphere to raise a temperature thereof.

3. The heat treatment method according to claim 1, wherein a roughness of the surface of said susceptor in contact with the substance to be treated is 50 μm or below.

* * * * *